(12) United States Patent
Chang et al.

(10) Patent No.: US 7,714,750 B2
(45) Date of Patent: May 11, 2010

(54) AUDIO PROCESSING CIRCUIT AND METHOD

(75) Inventors: Zhi-Ren Chang, Hsinchu (TW);
 Shin-Ing Hsieh, Hsinchu (TW);
 Kuo-Feng Hsu, Hsinchu (TW);
 Chi-Han Lan, Taipei (TW); Horng-Der Chang, HuaLien (TW)

(73) Assignee: Mstar Semiconductor, Inc., Hsinchu Hsien (TW)

( * ) Notice: Subject to any disclaimer, the term of this patent is extended or adjusted under 35 U.S.C. 154(b) by 813 days.

(21) Appl. No.: 11/612,113

(22) Filed: Dec. 18, 2006

(65) Prior Publication Data

US 2007/0299552 A1 Dec. 27, 2007

(30) Foreign Application Priority Data

Jun. 23, 2006 (TW) .............................. 95122828 A

(51) Int. Cl.
 *H03M 7/00* (2006.01)
(52) U.S. Cl. ...................... 341/61; 341/143; 341/144
(58) Field of Classification Search .................. 341/61
 See application file for complete search history.

(56) References Cited

U.S. PATENT DOCUMENTS 6,215,423 B1 * 4/2001 May et al. .................... 341/61
7,061,409 B1 * 6/2006 Jantti et al. ................... 341/61
2004/0143350 A1 7/2004 Lin
2005/0152554 A1 7/2005 Wu

FOREIGN PATENT DOCUMENTS

| JP | 200579699 A | 3/2005 |
|---|---|---|
| JP | 2006101445 A | 4/2006 |

\* cited by examiner

*Primary Examiner*—Khai M Nguyen
(74) *Attorney, Agent, or Firm*—Kirton & McConkie; Evan R. Witt

(57) ABSTRACT

An audio processing circuit includes a clock synthesizer, a clock divider, a digital interpolator module, a sampling rate converter and a digital-to-analog converter. The clock synthesizer generates a base clock signal according to a sampling clock signal and a first reference clock signal. The clock divider generates a multiple frequency clock signal according to the base clock signal. The digital interpolator module interpolates a digital audio data according to the multiple frequency clock signal. The sampling rate converter processes the interpolated digital audio data into a re-sampled digital audio data according to the multiple frequency clock signal and a second reference clock signal. The digital-to-analog converter is coupled to the sampling rate converter for converting the re-sampled digital audio data into an analog audio signal according to the second reference clock signal.

20 Claims, 5 Drawing Sheets

AUDIO PROCESSING CIRCUIT AND METHOD

FIELD OF THE INVENTION

The present invention relates to an audio processing circuit and associated method, and more particularly to an audio processing circuit integrated with a video processing circuit in an IC chip and associated method.

BACKGROUND OF THE INVENTION

Conventionally, video, audio and other functional chips are independently designed for corresponding applications. Nowadays, it has become a trend to integrate circuitry of different functions in a single IC chip so as to enhance performance and reduce cost. For example, a liquid crystal display (LCD) TV has experienced great growth and is now rapidly gaining in popularity but the video chip 11 and the audio chip 12 of a conventional LCD TV are independently designed and disposed on a system circuit board, as shown in FIG. 1.

For circuitry simplification and cost-effectiveness, a single IC chip integrating therein a video circuitry module and an audio circuitry module is developed. As shown in FIG. 2, the conventional IC chip includes an interpolator 21, a digital-to-analog converter (DAC) 25 and a phase-locked loop (PLL) circuit 26 as a part of the audio circuitry module. The PLL circuit 26 generates a high-quality and high-frequency (n*Fs) clock signal according to a sampling clock signal with a frequency Fs (e.g. 32 kHz or 48 kHz) that is associated with a digital audio data, and the digital audio data is to be processed by the interpolator 21 and the digital-to-analog converter (DAC) 25 according to the clock signal with the frequency n*Fs. In other words, the interpolator 21 interpolates the digital audio data with reference to the high frequency n*Fs. The DAC 25 then converts the digital audio data into analog audio data with reference to the high frequency n*Fs.

The PLL circuit 26 is an analog circuit generally occupying a large layout area.

SUMMARY OF THE INVENTION

The present invention provides an audio processing circuit for use in an IC chip performing both audio and video effects while exempting from using a PLL circuit.

In accordance with an aspect of the present invention, there is provided an audio processing circuit. The audio processing circuit includes a clock synthesizer, a clock divider, a digital interpolator module, a sampling rate converter and a digital-to-analog converter. The clock synthesizer generates a base clock signal according to a sampling clock signal and a first reference clock signal. The clock divider is coupled to the clock synthesizer for generating a multiple frequency clock signal according to the base clock signal. The digital interpolator module is coupled to the clock divider for performing an interpolation operation of a digital audio data according to the multiple frequency clock signal. The sampling rate converter is coupled to the digital interpolator module and the clock divider for processing the interpolated digital audio data into a re-sampled digital audio data according to the multiple frequency clock signal and a second reference clock signal. The digital-to-analog converter is coupled to the sampling rate converter for converting the re-sampled digital audio data into an analog audio signal according to the second reference clock signal.

In an embodiment, the multiple frequency clock signal generated by the clock divider includes a first the multiple frequency clock signal and a second multiple frequency clock signal having a frequency smaller than the first multiple frequency clock signal. For example, the frequency of the first multiple frequency clock signal is 256 times the frequency of the sampling clock signal, and the frequency of the second multiple frequency clock signal is 8 times the frequency of the sampling clock signal.

In an embodiment, the digital interpolator circuit module further comprises a filter, an FIFO buffer and a linear interpolator. The filter performs a first interpolation of the digital audio data according to the second multiple frequency clock signal to increase sampling points. The FIFO buffer is coupled to the filter for buffering the digital audio data in a first-in-first-out manner according to the second multiple frequency clock signal. The linear interpolator is coupled to the FIFO buffer and performs a second interpolation of the digital audio data received from the FIFO buffer according to the first multiple frequency clock signal to further increase sampling points.

Preferably, the second reference clock signal is generated from an oscillator.

In an embodiment, the audio processing circuit is integrated in an IC chip along with a video processing circuit, and the second reference clock signal is provided to both the audio processing circuit and the video processing circuit.

In an embodiment, the IC chip and the oscillator are two separate devices included in a multimedia apparatus.

In an embodiment, the multimedia apparatus is a display.

In an embodiment, the frequency of the second reference clock signal is close to the frequency of the first multiple frequency clock signal to a certain level.

In an embodiment, the first reference clock signal is generated from a PLL included in the video processing circuit.

In an embodiment, the digital-to-analog converter is a Delta-Sigma digital-to-analog converter.

In an embodiment, the frequency of the first reference clock signal is greater than 200 MHz, and the frequency of the first reference clock signal is about 14.318 MHz.

In accordance with another aspect of the present invention, there is provided an audio processing method. Firstly, a base clock signal is generated according to a sampling clock signal and a first reference clock signal. Then, a multiple frequency clock signal is generated. According to the multiple frequency clock signal, an interpolation of a digital audio data is performed. Then, the interpolated digital audio data is processed with the multiple frequency clock signal, and a re-sampled digital audio data is outputted according to a second reference clock signal. Afterwards, the re-sampled digital audio data is converted into an analog audio signal according to the second reference clock signal.

In an embodiment, the multiple frequency clock signal includes a first multiple frequency clock signal and a second multiple frequency clock signal having a frequency smaller than the first multiple frequency clock signal. For example, the first multiple frequency clock signal is 256 times the frequency of the sampling clock signal, and the second multiple frequency clock signal is 8 times the frequency of the sampling clock signal.

In an embodiment, the step of performing the interpolation of the digital audio data comprises the sub-steps of performing a first interpolation of the digital audio data according to the second multiple frequency clock signal to increase sampling points, buffering the digital audio data in a first-in-first-out manner according to the second multiple frequency clock signal, and performing a second interpolation of the processed digital audio data received from the FIFO buffer according to the first multiple frequency clock signal to further increase sampling points.

In an embodiment, the second reference clock signal is received from an external device, and the frequency of the second reference clock signal is close to the frequency of the first multiple frequency clock signal to a certain level.

In accordance with a further aspect of the present invention, there is provided an IC chip for use in a multimedia apparatus for audio/video effect control. The IC chip is integrated therein an audio processing circuit and a video processing circuit. The audio processing circuit comprises a first clock synthesizer, a first clock divider, a digital interpolator module, a sampling rate converter and a digital-to-analog converter. The first clock synthesizer generates a first base clock signal according to a first sampling clock signal and a first reference clock signal. The first clock divider is coupled to the first clock synthesizer for generating a first multiple frequency clock signal having a relatively high frequency and a second multiple frequency clock signal having a relatively low frequency according to the first base clock signal. The digital interpolator module is coupled to the first clock divider for performing an interpolation operation of a first digital audio data according to the first multiple frequency clock signal and the second multiple frequency clock signal. The sampling rate converter is coupled to the digital interpolator module and the first clock divider for processing the interpolated first digital audio data into a re-sampled first digital audio data according to the first multiple frequency clock signal and a second reference clock signal. The digital-to-analog converter is coupled to the sampling rate converter for converting the re-sampled first digital audio data into an analog audio signal according to the second reference clock signal.

In an embodiment, the IC chip further comprises a second clock synthesizer and a second clock divider. The second clock synthesizer is generates a second base clock signal according to a second sampling clock signal and the first reference clock signal. The second clock divider is coupled to the second clock synthesizer for generating a third multiple frequency clock signal having a relatively high frequency and a fourth multiple frequency clock signal having a relatively low frequency according to the second base clock signal. The digital interpolator module is coupled to the second clock divider for performing an interpolation operation of a second digital audio data according to the third multiple frequency clock signal and the fourth multiple frequency clock signal. The sampling rate converter is coupled to the second clock divider for processing the interpolated second digital audio data into a re-sampled second digital audio data according to the third multiple frequency clock signal and the second reference clock signal. The digital-to-analog converter converts the re-sampled second digital audio data into another analog audio signal according to the second reference clock signal.

In an embodiment, the first reference clock signal is received from the video processing circuit, and the second reference clock is received from an oscillator outside the IC chip.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
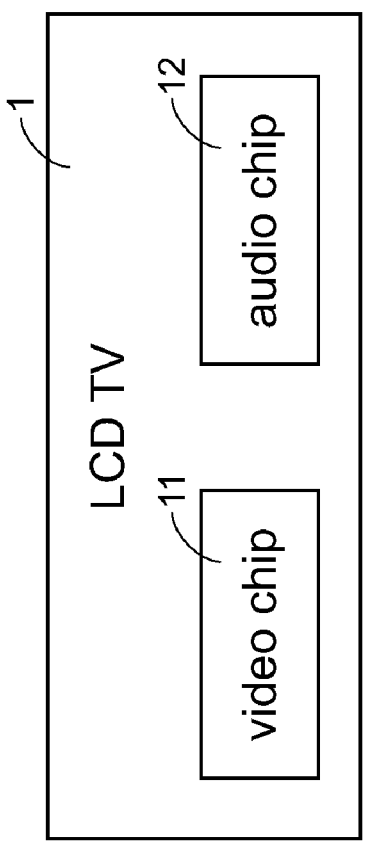
FIG. 1 is a schematic functional block diagram illustrating a LCD TV with an audio chip and a video chip.
Figure 2:
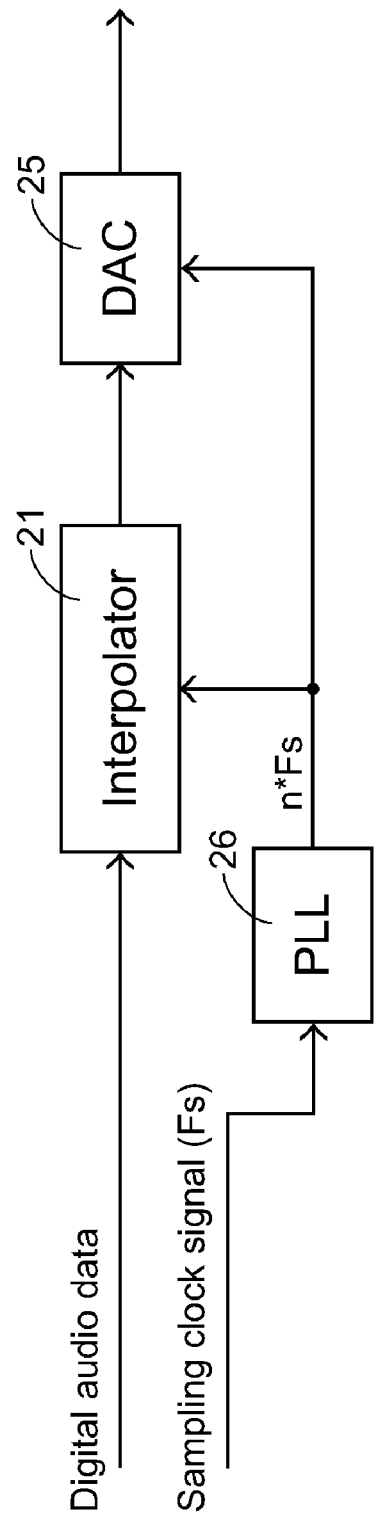
FIG. 2 is a schematic functional block diagram illustrating a portion of the audio circuit module integrated in an IC chip.
Figure 3:
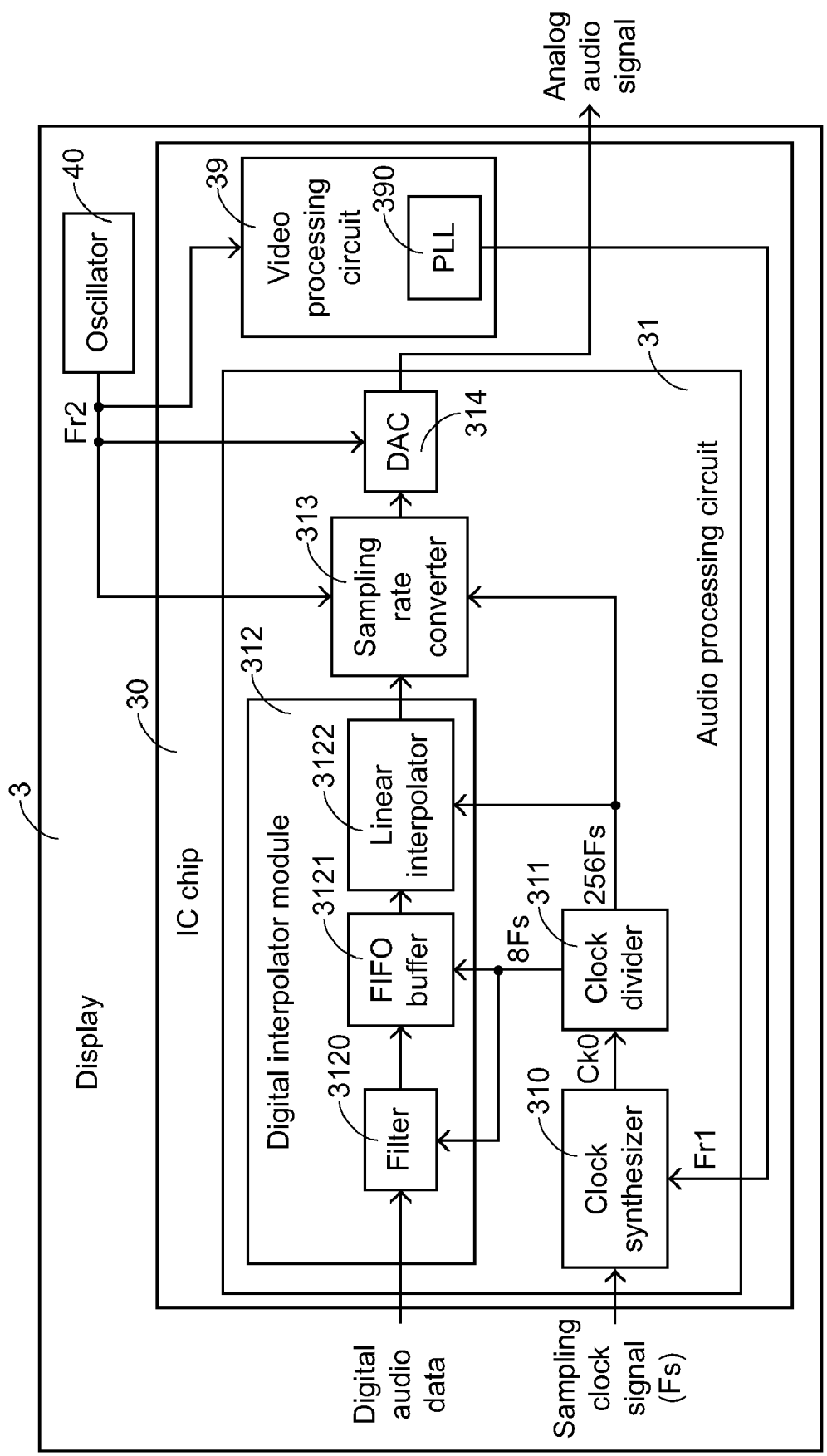
FIG. 3 is a schematic functional block diagram illustrating an IC chip integrating therein an audio processing circuit and a video processing circuit according to an embodiment of the present invention.

Referring to FIG. 3, an IC chip 30 includes an audio processing circuit 31 and a video processing circuit 39, and is disposed in a display 3. The audio processing circuit 31 includes a clock synthesizer 310, a clock divider 311, a digital interpolator module 312, a sampling rate converter 313 and a digital-to-analog converter (DAC) 314.

According to a sampling clock signal Fs and a first reference clock signal Fr1, the clock synthesizer 310 generates a base clock signal CK0. The first reference clock signal Fr1 is generated from a PLL 390. The PLL 390 generates the first reference clock signal Fr1 having a high operating frequency, e.g. greater than 200 MHz, in lieu of an analog phase-locked loop (PLL) circuit conventionally used in an audio processing circuit. For example, the PLL 390 can be a PLL inherently existing in the display 3 for providing a reference clock signal to the video processing circuit 39, which is disposed in the video processing circuit 39 as shown in FIG. 3. According to the base clock signal CK0, the clock divider 311 generates a first multiple frequency clock signal and a second multiple frequency clock signal for operating other circuits.

The clock synthesizer 310 and the clock divider 311 are essentially digital circuits well-known in the art, and thus the operational principles and detailed configurations are omitted here. Generally, the clock synthesizer 310 and the clock divider 311 require hundreds of logic gates, with a total layout area which is approximately one hundredth of the layout area of the conventional PLL circuit. While the digital circuit occupies much less layout area in comparison with analog circuit, the audio processing circuit 31 shown in FIG. 3 is also advantageous over the prior art in shrinking circuit area along with process progress.

As mentioned above, the clock synthesizer 310 and the clock divider 311 provide the first and second multiple frequency clock signals for the digital interpolator module 312 and sampling rate converter 313. For example, the base clock signal CK0 is 512*Fs and the clock divider 311 generates multiple frequency clock signals 8*Fs and 256*Fs accordingly. The digital interpolator module 312 includes a filter 3120, an FIFO (first in first out) buffer 3121 and a linear interpolator 3122. According to the second multiple frequency clock signal, the filter 3120 performs a first interpolation of a first digital audio data, thereby generating a preliminary digital audio data having increased sampling points. According to the second multiple frequency clock signal (8 Fs), the preliminary digital audio data is temporarily stored in the FIFO buffer 3121 in a first-in-first-out manner. According to the first multiple frequency clock signal (256 Fs), the linear interpolator 3122 performs a second interpolation of the preliminary digital audio data stored in the FIFO buffer 3121, thereby generating a second digital audio data. Depending on the sampling rate of the digital-to-analog converter 314, the sampling points of the second digital audio data are variable. For example, the first and second multiple frequency clock signals have a 256-time frequency (256 Fs) and an 8-time frequency (8 Fs), respectively.

Since the clock synthesizer 310 and the clock divider 311 are essentially digital circuits, the resulting multiple frequency clock signals possess larger jitter. Nevertheless, such multiple frequency clock signals are applicable to the digital interpolator module 312. However, these multiple frequency clock signals are not applicable to the sampling rate converter 313 and the digital-to-analog converter 314 for the quality issue. Therefore, a second reference clock signal Fr2, which is stable with a high frequency, is provided to the sampling rate converter 313 and the digital-to-analog converter 314 for processing the second digital audio data. The second reference clock signal Fr2 is preferably generated from an oscillator 40 originally existing in the display 3. For example, the oscillator 40 inherently provides a stable clock signal to the video processing circuit 39. For example, the operating frequency of the oscillator 40 is as approximating to the frequency of the first multiple frequency clock signal as possible. For example, if the frequency of the sampling clock signal Fs is 48 kHz, the frequency of the first multiple frequency clock signal, which is 256 times of the frequency of the sampling clock signal Fs, is about 12.288 MHz. In this embodiment, the frequency of the second reference clock signal Fr2 generated by the oscillator 40 and inherently provided to the video processing circuit 39 is 14.318 MHz. The second reference clock signal Fr2 is applicable to the sampling rate converter 313 and the digital-to-analog converter 314. After the sampling rate converter 313 receives and processes the second digital audio data according to the first multiple frequency clock signal, a re-sampled digital audio data is outputted according to the second reference clock signal Fr2. Then the re-sampled digital audio data is converted into analog audio data by the digital-to-analog converter 314 according to the second reference clock signal Fr2. For example, the digital-to-analog converter (DAC) 314 is preferably a Delta-Sigma DAC.

If the frequency of the sampling clock signal Fs is 32 kHz, the frequency of the first multiple frequency clock signal will be about 8.192 MHz. On the other hand, the frequency of the second reference clock signal Fr2 generated by the oscillator 40 is about 14.318 MHz. For example, by adjusting the parameters of the clock synthesizer 310 and the clock divider 311, the output frequency 256 times of that of the sampling clock signal Fs can be changed to 512 times of that of the sampling clock signal Fs. Accordingly, the frequency of the first multiple frequency clock signal is about 16.384 MHz, which is close to the frequency of the second reference clock signal Fr2, 14.318 MHz, so as to improve the audio output quality.

Figure 4A:
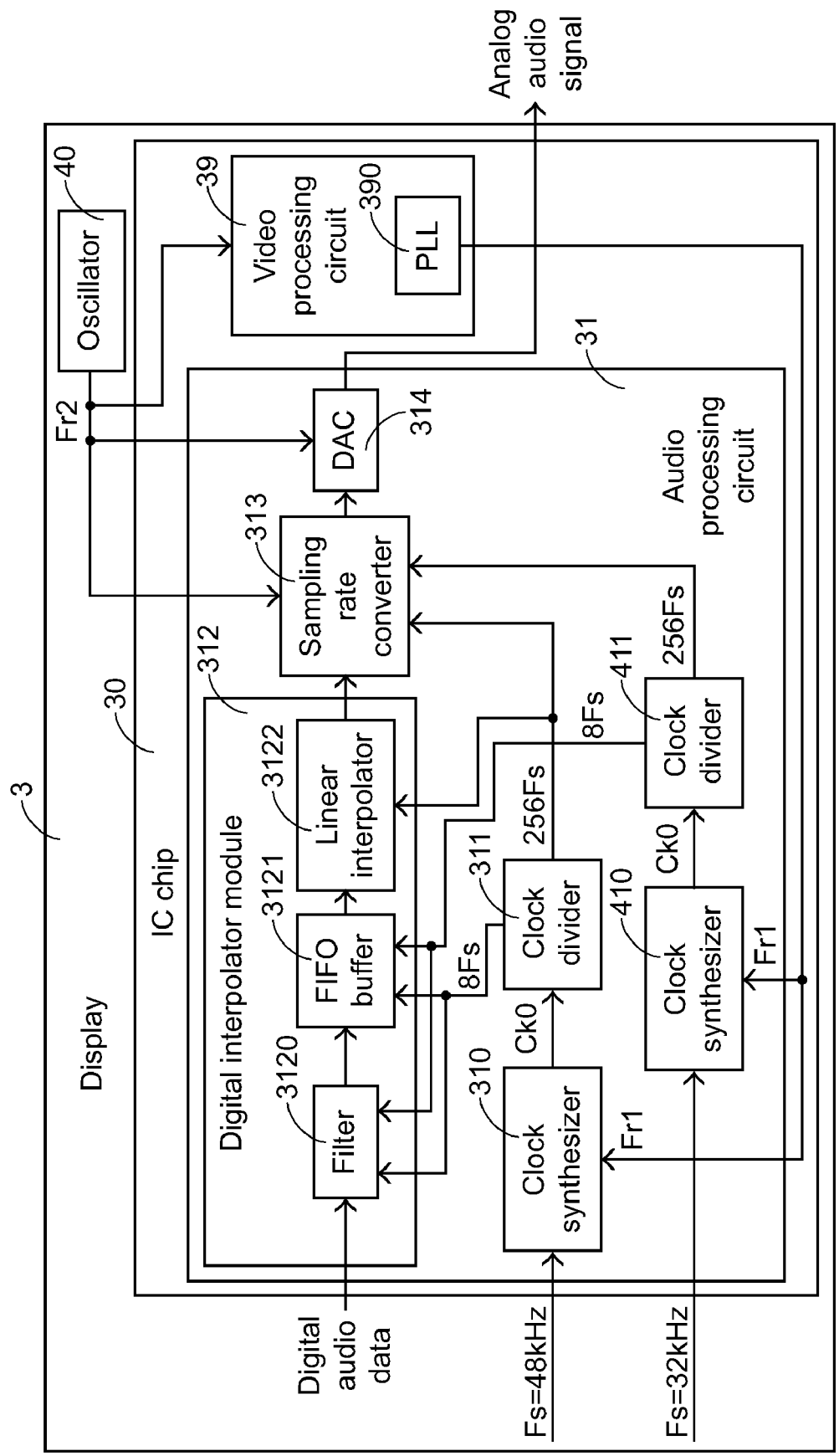
FIG. 4A is a schematic functional block diagram illustrating an IC chip integrating an audio processing circuit and a video processing circuit according to another embodiment of the present invention.
Figure 4B:
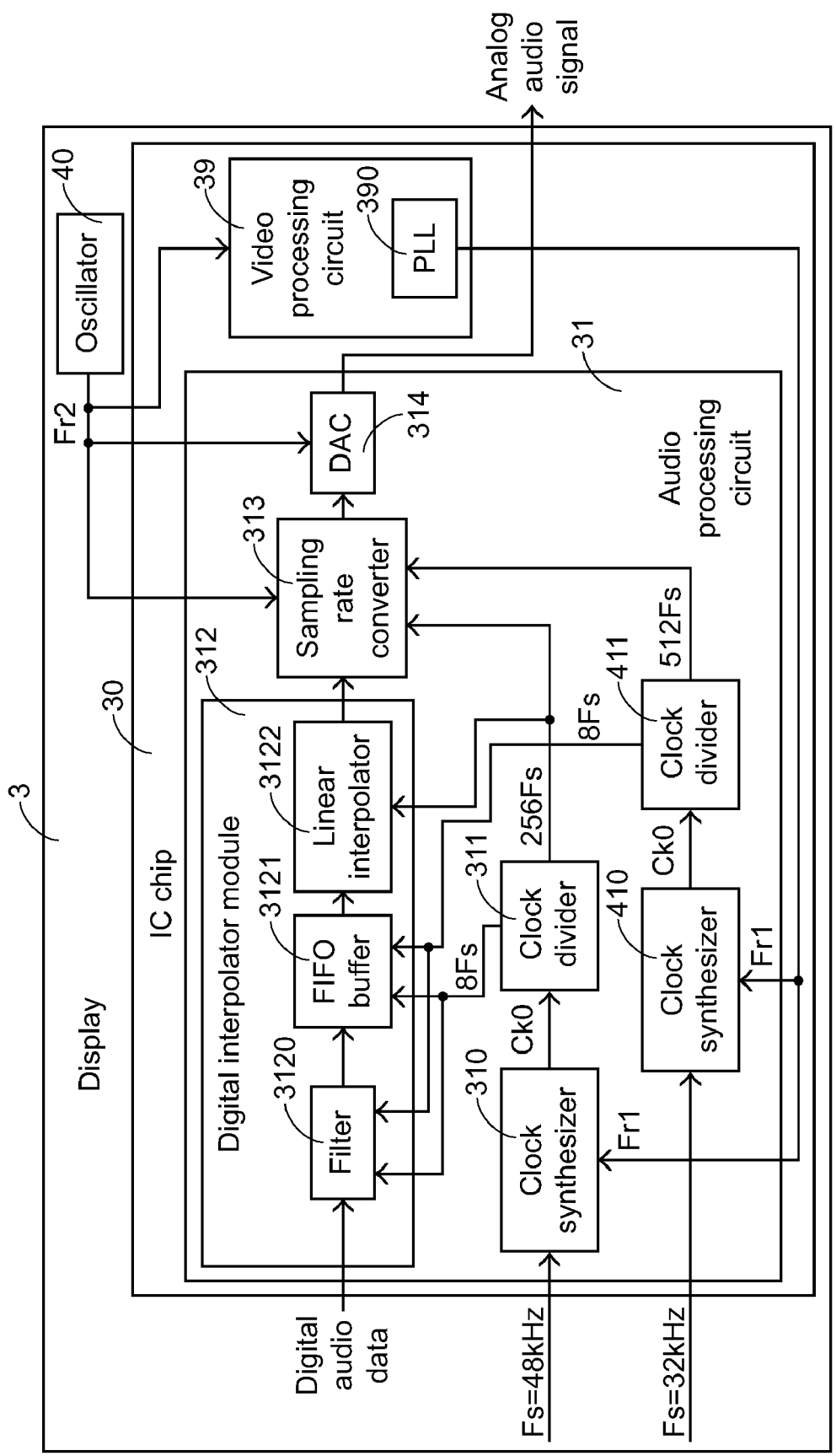
FIG. 4B is a schematic functional block diagram illustrating an IC chip integrating therein an audio processing circuit and a video processing circuit according to another embodiment of the present invention.

On the other hand, in case a first audio signal with a 32 kHz frequency and a second audio signal with a 48 kHz frequency are to be processed at the same time, the circuits of the clock synthesizer 310 and the clock divider 311 are duplicated to generate respectively required multiple frequency clock signals, as illustrated in FIG. 4A or 4B. In the embodiment of FIG. 4A, for example, the multiple frequency clock signal generated by the clock synthesizer 310 and the clock divider 311 is about 12.288 MHz which is 256 times of the frequency of a first sampling clock signal, 48 kHz, while the multiple frequency clock signal generated by the clock synthesizer 410 and the clock divider 411 is about 8.192 MHz which is 256 times of the frequency of a second sampling clock signal, 32 kHz. On the other hand, in the embodiment of FIG. 4B, for example, the multiple frequency clock signal generated by the clock synthesizer 310 and the clock divider 311 is about 12.288 MHz which is 256 times of the frequency of the first sampling clock signal, 48 kHz, while the multiple frequency clock signal generated by the clock synthesizer 410 and the clock divider 411 is about 16.384 MHz which is 512 times of the frequency of the second sampling clock signal, 32 kHz. In both of the above embodiments, the 14.318 MHz clock signal generated by the oscillator 40 can be used for both of the two sets of clock synthesizer and clock divider as a reference clock signal. In comparison with the prior art that requires two PLL circuits 26 to simultaneously process two audio signals, the layout area of the present invention is considerably reduced. Therefore, the present invention is advantageous in processing a plurality of audio inputs. For example, the user may record a TV program while watching a film.

As illustrated in the above embodiments, the audio processing circuit according to the present invention does not require additional bulky PLL circuit for audio processing. Instead, a proper clock synthesizer and a clock divider, which inherently exist, for example, in the display controller, are used to provide two reference clock signals.

Figure 5:
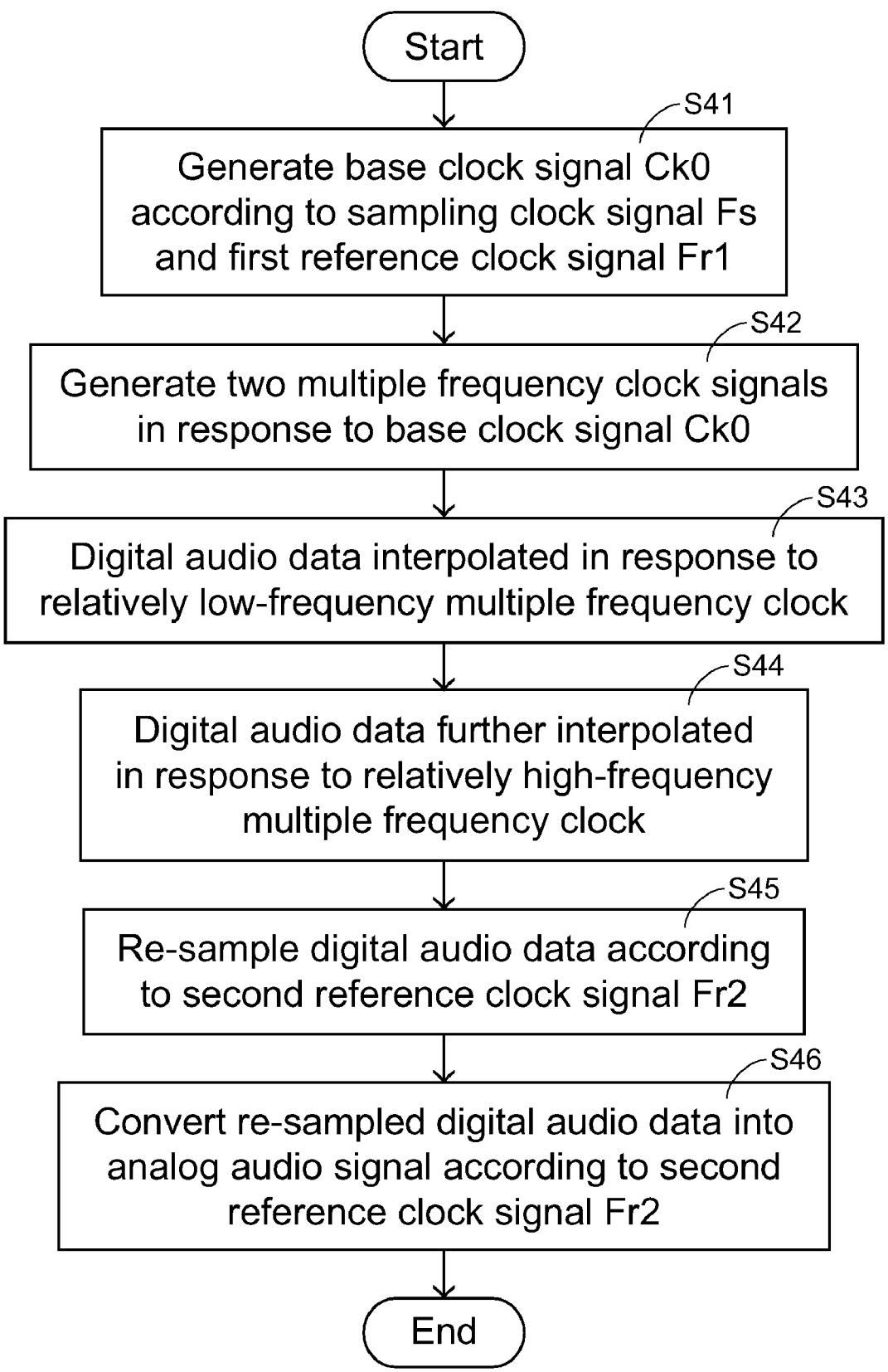
FIG. 5 is a flowchart illustrating an audio processing method according to an embodiment of the present invention.

FIG. 5 illustrates an audio processing method flowchart according to one embodiment of the present invention. First of all, a base clock signal CK0 is generated according to a sampling clock signal Fs and a first reference clock signal Fr1 (Step S41). The first reference clock signal Fr1, for example, can also be applied to a video processing circuit. The base clock signal CK0 is then processed into one or more multiple frequency clock signals (Step S42). For example, a relatively low-frequency multiple frequency clock is provided for an interpolation operation and a buffering operation of an inputted digital audio data, thereby increasing the sampling points of the digital audio data (Step S43). On the other hand, a relatively high-frequency multiple frequency clock is provided for an interpolation operation of the digital audio data to further increase the sampling points of the digital audio data (Step S44). Afterwards, the digital audio data is re-sampled according to a second reference clock signal Fr2 (Step S45). The second reference clock signal Fr2 can also be applied to the video processing device. The re-sampled digital audio data is converted into an analog audio signal according to the second reference clock signal Fr2 (Step S46).

The audio processing circuit and the audio processing method according to the present invention can be applied to a variety of multimedia devices such as TVs or DVD recorders.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An audio processing circuit, comprising:
   a clock synthesizer for generating a base clock signal according to a sampling clock signal and a first reference clock signal;
   a clock divider coupled to the clock synthesizer for generating a multiple frequency clock signal according to the base clock signal;
   a digital interpolator module coupled to the clock divider for interpolating a digital audio data according to the multiple frequency clock signal;
   a sampling rate converter coupled to the digital interpolator module and the clock divider for processing the interpolated digital audio data into a re-sampled digital audio data according to the multiple frequency clock signal and a second reference clock signal; and
   a digital-to-analog converter coupled to the sampling rate converter for converting the re-sampled digital audio data into an analog audio signal according to the second reference clock signal.

2. The audio processing circuit according to claim 1 wherein the multiple frequency clock signal generated by the clock divider includes a first the multiple frequency clock signal and a second multiple frequency clock signal having a frequency smaller than the first multiple frequency clock signal.

3. The audio processing circuit according to claim 2 wherein the frequency of the first multiple frequency clock signal is 256 times the frequency of the sampling clock signal, and the frequency of the second multiple frequency clock signal is 8 times the frequency of the sampling clock signal.

4. The audio processing circuit according to claim 2 wherein the digital interpolator circuit module further comprises:
   a filter performing a first interpolation of the digital audio data according to the second multiple frequency clock signal to increase sampling points;
   an FIFO buffer coupled to the filter for buffering the digital audio data in a first-in-first-out manner according to the second multiple frequency clock signal; and
   a linear interpolator, coupled to the FIFO buffer, for performing a second interpolation of the digital audio data received from the FIFO buffer according to the first multiple frequency clock signal.

5. The audio processing circuit according to claim 1 wherein the second reference clock signal is generated from an oscillator.

6. The audio processing circuit according to claim 5 wherein the audio processing circuit is integrated in an IC chip along with a video processing circuit, and the second reference clock signal is provided to both the audio processing circuit and the video processing circuit.

7. The audio processing circuit according to claim 6 wherein the oscillator is positioned outside the IC chip.

8. The audio processing circuit according to claim 7 wherein the audio processing circuit is implemented in a display controller.

9. The audio processing circuit according to claim 6 wherein the frequency of the second reference clock signal is close to the frequency of the first multiple frequency clock signal to a preset level.

10. The audio processing circuit according to claim 6 wherein the first reference clock signal is generated from a clock source included in the video processing circuit.

11. The audio processing circuit according to claim 1 wherein the digital-to-analog converter is a Delta-Sigma digital-to-analog converter.

12. The audio processing circuit according to claim 1 wherein the frequency of the first reference clock signal is greater than 200 MHz, and the frequency of the first reference clock signal is about 14.318 MHz.

13. An audio processing method, comprising steps of:
   generating a base clock signal according to a sampling clock signal and a first reference clock signal;
   generating a multiple frequency clock signal;
   interpolating a digital audio data according to the multiple frequency clock signal;
   processing the interpolated digital audio data with the multiple frequency clock signal and outputting a re-sampled digital audio data according to a second reference clock signal; and
   converting the re-sampled digital audio data into an analog audio signal according to the second reference clock signal.

14. The audio processing method according to claim 13 wherein the multiple frequency clock signal includes a first multiple frequency clock signal and a second multiple frequency clock signal having a frequency smaller than the first multiple frequency clock signal.

15. The audio processing method according to claim 14 wherein the first multiple frequency clock signal is 256 times the frequency of the sampling clock signal, and the second multiple frequency clock signal is 8 times the frequency of the sampling clock signal.

16. The audio processing method according to claim 14 wherein the step of interpolating the digital audio data comprises:
   performing a first interpolation of the digital audio data according to the second multiple frequency clock signal to increase sampling points;
   buffering the digital audio data according to the second multiple frequency clock signal; and
   performing a second interpolation of the buffered digital audio data according to the first multiple frequency clock signal.

17. The audio processing method according to claim 13 wherein the second reference clock signal is received from an external oscillator, and the frequency of the second reference clock signal is close to the frequency of the first multiple frequency clock signal to a preset level.

18. An IC chip for use in a multimedia apparatus, comprising:
   a video processing circuit, for processing a video signal; and
   an audio processing circuit, comprising:
      a first clock synthesizer for generating a first base clock signal according to a first sampling clock signal and a first reference clock signal;
      a first clock divider coupled to the first clock synthesizer for generating a first multiple frequency clock signal having a relatively high frequency and a second multiple frequency clock signal having a relatively low frequency according to the first base clock signal;
      a digital interpolator module coupled to the first clock divider for interpolating a first digital audio data according to the first multiple frequency clock signal and the second multiple frequency clock signal;
      a sampling rate converter coupled to the digital interpolator module and the first clock divider for processing the interpolated first digital audio data into a re-sampled first digital audio data according to the first multiple frequency clock signal and a second reference clock signal; and a digital-to-analog converter coupled to the sampling rate converter for converting the re-sampled first digital audio data into an analog audio signal according to the second reference clock signal.

19. The IC chip according to claim 18, further comprising:

a second clock synthesizer for generating a second base clock signal according to a second sampling clock signal and the first reference clock signal; and a second clock divider coupled to the second clock synthesizer for generating a third multiple frequency clock signal having a relatively high frequency and a fourth multiple frequency clock signal having a relatively low frequency according to the second base clock signal, wherein the digital interpolator module is coupled to the second clock divider for interpolating a second digital audio data according to the third multiple frequency clock signal and the fourth multiple frequency clock signal; the sampling rate converter is coupled to the second clock divider for processing the interpolated second digital audio data into a re-sampled second digital audio data according to the third multiple frequency clock signal and the second reference clock signal; and the digital-to-analog converter converts the re-sampled second digital audio data into another analog audio signal according to the second reference clock signal.

20. The IC chip according to claim 18 wherein the first reference clock signal is received from the video processing circuit, and the second reference clock is received from an oscillator outside the IC chip.

* * * * *